United States Patent
Asakawa et al.

(10) Patent No.: US 10,877,374 B2
(45) Date of Patent: Dec. 29, 2020

(54) PATTERN FORMATION METHOD AND PATTERN FORMATION MATERIAL

(71) Applicant: TOSHIBA MEMORY CORPORATION, Kanagawa (JP)

(72) Inventors: Koji Asakawa, Kawasaki Kanagawa (JP); Seekei Lee, Kawasaki Kanagawa (JP); Naoko Kihara, Matsudo Chiba (JP); Norikatsu Sasao, Kawasaki Kanagawa (JP); Tomoaki Sawabe, Taito Tokyo (JP); Shinobu Sugimura, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 148 days.

(21) Appl. No.: 15/916,229

(22) Filed: Mar. 8, 2018

(65) Prior Publication Data

US 2019/0086803 A1   Mar. 21, 2019

(30) Foreign Application Priority Data

Sep. 15, 2017 (JP) ................................. 2017-178216

(51) Int. Cl.

| | |
|---|---|
| *G03F 7/039* | (2006.01) |
| *G03F 7/16* | (2006.01) |
| *G03F 7/20* | (2006.01) |
| *G03F 7/038* | (2006.01) |
| *G03F 7/004* | (2006.01) |
| *G03F 7/32* | (2006.01) |
| *G03F 7/40* | (2006.01) |

(52) U.S. Cl.
CPC ............ *G03F 7/039* (2013.01); *G03F 7/0042* (2013.01); *G03F 7/0047* (2013.01); *G03F 7/038* (2013.01); *G03F 7/0392* (2013.01); *G03F 7/162* (2013.01); *G03F 7/2006* (2013.01); *G03F 7/327* (2013.01); *G03F 7/40* (2013.01); *G03F 7/405* (2013.01)

(58) Field of Classification Search
CPC .................................... G03F 7/40; G03F 7/405
See application file for complete search history.

(56) References Cited

U.S. PATENT DOCUMENTS

| | | | |
|---|---|---|---|
| 6,303,266 B1 | 10/2001 | Okino et al. | |
| 6,486,330 B1 | 11/2002 | Nakano | |
| 7,902,385 B2 | 3/2011 | Ohashi et al. | |
| 2006/0110686 A1* | 5/2006 | Park ...................... | G03F 7/0392 430/315 |
| 2014/0255852 A1* | 9/2014 | Iwao ......................... | G03F 7/38 430/325 |
| 2019/0064672 A1* | 2/2019 | Murayama ................ | G03F 7/40 |

FOREIGN PATENT DOCUMENTS

| | | |
|---|---|---|
| JP | 2000-122294 A | 4/2000 |
| JP | 2001-72674 A | 3/2001 |
| JP | 2008-31160 A | 2/2008 |
| JP | 2011-79877 A | 4/2011 |

\* cited by examiner

*Primary Examiner* — Kathleen Duda
(74) *Attorney, Agent, or Firm* — Finnegan, Henderson, Farabow, Garrett & Dunner, L.L.P.

(57) ABSTRACT

According to one embodiment, a pattern formation method is disclosed. The method can include a film formation process, and a exposure process. The film formation process forms a pattern formation material film on a base body. The pattern formation material film includes a pattern formation material including a first portion and a second portion. The first portion includes at least one of acrylate or methacrylate. The second portion includes an alicyclic compound and a carbonyl group. The alicyclic compound has an ester bond to the at least one of the acrylate or the methacrylate. The carbonyl group is bonded to the alicyclic compound. The exposure process causes the pattern formation material film to expose to a metal compound including a metallic element.

10 Claims, 3 Drawing Sheets

PATTERN FORMATION METHOD AND PATTERN FORMATION MATERIAL

CROSS-REFERENCE TO RELATED APPLICATIONS

This application is based upon and claims the benefit of priority from Japanese Patent Application No. 2017-178216, filed on Sep. 15, 2017; the entire contents of which are incorporated herein by reference.

FIELD

Embodiments described herein relate generally to a pattern formation method and a pattern formation material.

BACKGROUND

For example, there is a pattern formation material such as a resist material, etc., for which the solubility is controlled by irradiating ultraviolet, etc. There is a pattern formation method that uses such a pattern formation material. It is desirable to improve the productivity of the pattern formation method and the pattern formation material.

DETAILED DESCRIPTION

Figure 1A:
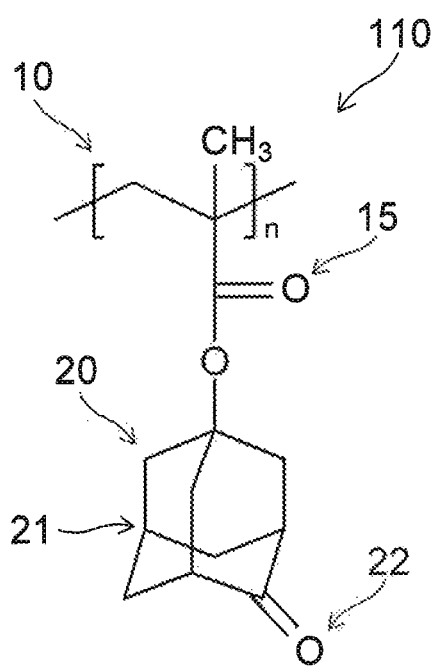
FIG. 1A and FIG. 1B are schematic views illustrating a pattern formation material used in a pattern formation method according to a first embodiment.

According to one embodiment, a pattern formation method is disclosed. The method can include a film formation process, and a exposure process. The film formation process forms a pattern formation material film on a base body. The pattern formation material film includes a pattern formation material including a first portion and a second portion. The first portion includes at least one of acrylate or methacrylate. The second portion includes an alicyclic compound and a carbonyl group. The alicyclic compound has an ester bond to the at least one of the acrylate or the methacrylate. The carbonyl group is bonded to the alicyclic compound. The exposure process causes the pattern formation material film to expose to a metal compound including a metal element.

According to another embodiment, a pattern formation material includes a first portion, and a second portion. The first portion includes at least one of acrylate or methacrylate. The second portion includes an alicyclic compound and a carbonyl group. The alicyclic compound has an ester bond to the at least one of the acrylate or the methacrylate. The carbonyl group is bonded to the alicyclic compound. The pattern formation material is used in a pattern formation method including causing a film including the pattern formation material to expose to a metal compound including a metal element.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
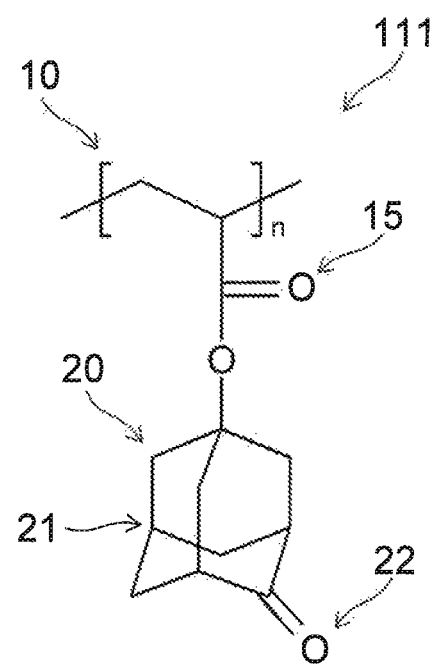

FIG. 1A and FIG. 1B are schematic views illustrating a pattern formation material used in a pattern formation method according to a first embodiment.

As shown in FIG. 1A and FIG. 1B, pattern formation materials 110 and 111 include a first portion 10 and a second portion 20.

In the example shown in FIG. 1A, the first portion 10 includes methacrylate. In the example shown in FIG. 1B, the first portion 10 includes acrylate. In the embodiment, the first portion 10 includes at least one of acrylate or methacrylate.

The second portion 20 includes an alicyclic compound 21 and a carbonyl group 22. The alicyclic compound 21 has an ester bond to the at least one of the acrylate or the methacrylate of the first portion 10 recited above. For example, the alicyclic compound 21 has an ester bond to the at least one of the acrylate or the methacrylate recited above directly or via an alkane having one to three carbons. The carbonyl group 22 is bonded to the alicyclic compound 21.

The alicyclic compound 21 may include, for example, multiple cyclic hydrocarbons bonded to each other. For example, the alicyclic compound 21 includes at least one selected from the group consisting of adamantane, tricyclodecane, isobornane, norbornane, and cyclohexane.

The first portion 10 may include a side chain. For example, the side chain of the first portion 10 may include a carbonyl group 15. The carbonyl group 15 may be included in the ester bond.

For example, a monomer that includes the first portion 10 and the second portion 20 is provided as a resist material by causing copolymerization with another acrylic compound.

For example, there are cases where a process is used in which a film of the pattern formation material is caused to expose to a metal compound including a metal element. By using the material recited above (the pattern formation material 110, 111, or the like), the metal compound can be introduced effectively to the film when using the process of causing the film of the pattern formation material to expose to the metal compound. Thereby, as described below, the productivity can be increased.

The pattern formation material according to the embodiment includes, for example, the composition represented by the following chemical formula.

[Chemical formula 1]

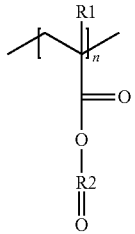

In the chemical formula recited above, "R1" is hydrogen or a methyl group. "R2" is an alicyclic compound (e.g., an alicyclic compound). The alicyclic compound includes at least one selected from the group consisting of an adamantane ring, a tricyclodecane ring, an isobornane ring, a norbornane ring, a tetracyclododecane ring, and a cyclohexane ring. By using the alicyclic compound, for example, good dry etching resistance is obtained. At least one selected from the group consisting of an alkyl group, a hydroxyl group, an amino group, and a carboxyl group may be added to "R2."

An example of a pattern formation method using such a material (the pattern formation material 110, 111, or the like) will now be described. An example in which the pattern formation material 110 is used will now be described. The method described below also is applicable in the case where the pattern formation material 111 is used.

FIG. 2A to FIG. 2F are schematic cross-sectional views illustrating the pattern formation method according to the first embodiment.

Figure 2A:
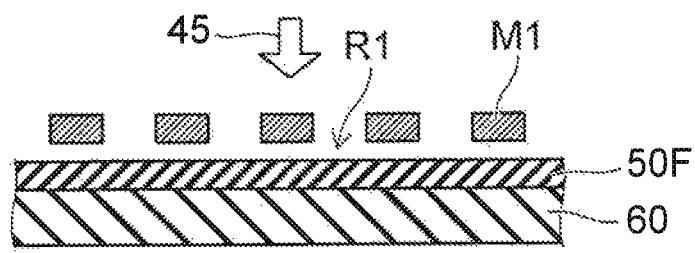
FIG. 2A to FIG. 2F are schematic cross-sectional views illustrating the pattern formation method according to the first embodiment.

As shown in FIG. 2A, a film 50F that includes the pattern formation material 110 is formed on the surface of a base body 60. Any method such as a spinner method, inkjet, or the like is applicable to form the film 50F.

As shown in FIG. 2A, an electromagnetic wave 45 is irradiated on a portion (a first region R1) of the film 50F. For example, the electromagnetic wave 45 is irradiated on the portion (the first region R1) of the film 50F from an opening of a mask M1. The irradiation of the electromagnetic wave 45 may include scanning a beam of the electromagnetic wave 45.

Subsequently, for example, developing is performed.

Figure 2B:
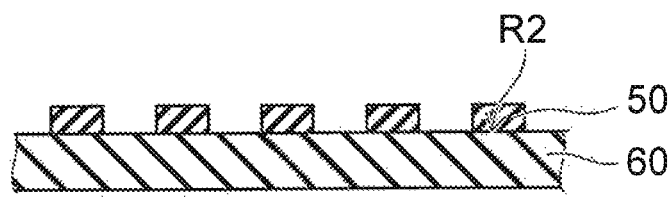

Thereby, as shown in FIG. 2B, the first region R1 where the electromagnetic wave 45 is irradiated is removed. Thereby, a second region R2 of the film 50F remains. The second region R2 of the film 50F is used to form a pattern formation material film 50.

Thus, the pattern formation method according to the embodiment includes a film formation process of forming, on the base body 60, the pattern formation material film 50 including the pattern formation, material 110. The film formation process includes, for example, a process of forming the film 50F including the pattern formation material 110 on the base body 60 (referring to FIG. 2A). The film formation process includes, for example, a process of irradiating the electromagnetic wave 45 on the first region R1 of the film 50F (referring to FIG. 2A).

In the embodiment, the peak wavelength of the electromagnetic wave 45 is, for example, not less than 193 nm but less than 194 nm. For example, the electromagnetic wave 45 is emitted from an ArF excimer laser.

The film formation process further includes a process of removing the first region R1 of the film 50F (referring to FIG. 2B). The pattern formation material film 50 is obtained from the remaining region (the second region R2) of the film 50F (referring to FIG. 2B).

For example, processing that uses an alkaline developer is performed in the process (e.g., the developing) of removing, for example, the first region R1 of the film 50F. The alkaline developer includes, for example, TMAH (tetramethylammonium hydroxide), etc.

Figure 2C:
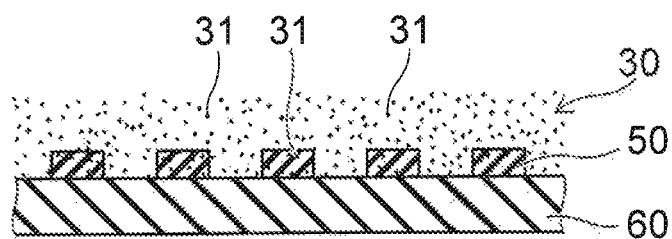

As shown in FIG. 2C, the pattern formation material film 50 is caused to expose to a metal compound 30 including a metal element 31.

The metal compound 30 includes, for example, an organic metal compound. The metal compound 30 includes, for example, trimethyl aluminum. The metal compound 30 may include, for example, chlorine and at least one selected from the group consisting of Ti, V, and W. The metal compound 30 may include, for example, at least one selected from the group consisting of $TiCl_4$, $VCl_4$, and $WCl_6$.

The metal compound 30 is, for example, a liquid or a gas.

Thus, in the exposure process, the pattern formation material film 50 is caused to expose to the metal compound 30 including the metal element 31. In the exposure process, for example, the metal compound 30 impregnates, for example, the pattern formation material film 50. Thus, the exposure process includes introducing the metal compound 30 to the pattern formation material film 50.

For example, the exposure process includes causing the pattern formation material film 50 to contact at least one of a liquid including the metal compound 30 or a gas including the metal compound 30. Thereby, for example, the metal element 31 that is included in the metal compound 30 adsorbs to the material included in the pattern formation material film 50. The adsorption is described below.

Figure 2D:
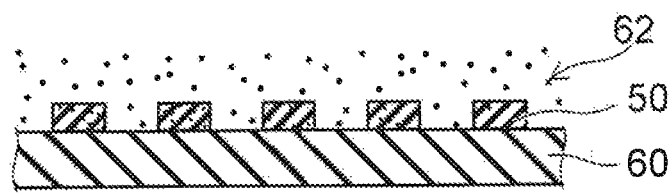

As shown in FIG. 2D, after the exposure process recited above, processing of the pattern formation material film 50 is performed in an atmosphere 62 including at least one selected from the group consisting of water, oxygen, and ozone. This processing includes heating. The temperature of the heating is, for example, not less than 50° C. and not more than 180° C. For example, oxidization is performed in the processing process.

Figure 2E:
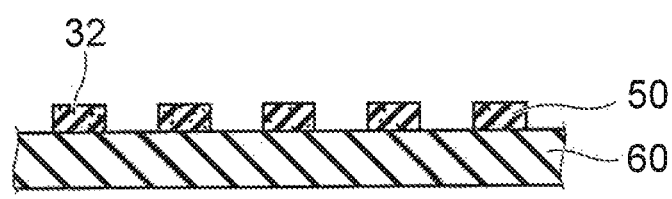

As shown in FIG. 2E, after the processing process, the pattern formation material film 50 includes, for example, an oxide 32 including the metal element 31. For example, the oxide 32 that includes aluminum is formed in the case where the metal compound 30 includes trimethyl aluminum. For example, the oxide 32 that includes titanium is formed in the case where the metal compound 30 includes $TiCl_4$. For example, the oxide 32 that includes vanadium is formed in the case where the metal compound 30 includes $VCl_4$. For example, the oxide 32 that includes tungsten is formed in the case where the metal compound 30 includes $WCl_6$. For example, "metalization" is performed.

The etching resistance of the pattern formation material film 50 is improved by forming the oxide 32 in the pattern formation material film 50. For example, the etching rate of dry etching using a gas including chlorine decreases.

Figure 2F:
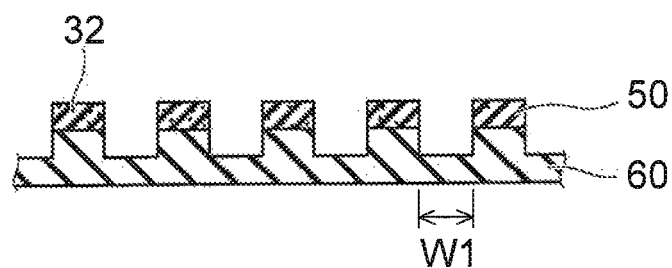

As shown in FIG. 2F, after the processing process (the oxidation treatment process) recited above, at least a portion of the region of the base body 60 not covered with the pattern formation material film 50 is removed. For example, etching is performed using the pattern formation material film 50 as a mask. The removal process includes, for example, causing the uncovered region recited above to contact a gas including fluorine and carbon. The etching is, for example, RIE (Reactive Ion Etching).

In the embodiment as recited above, the oxide 32 is formed in the pattern formation material film 50. Therefore, the etching resistance of the pattern formation material film 50 which is used as a mask improves. Thereby, good patternability is obtained in the etching (the removal process recited above) using the pattern formation material film 50 as a mask. High-precision patterning can be performed.

According to the embodiment, a pattern formation method can be provided in which it is possible to improve the productivity.

For example, good patternability is obtained also for patterning by etching in which the line width of the patterning is 100 nm or less. For example, a width W1 of at least a portion of the region recited above not covered with the pattern formation material film 50 is 100 nm or less. The width W1 is the width along one direction (a first direction) along the base body 60.

Examples of the bond between the metal element 31 included in the metal compound 30 and the material included in the pattern formation material film 50 will now be described.

Figure 3A:
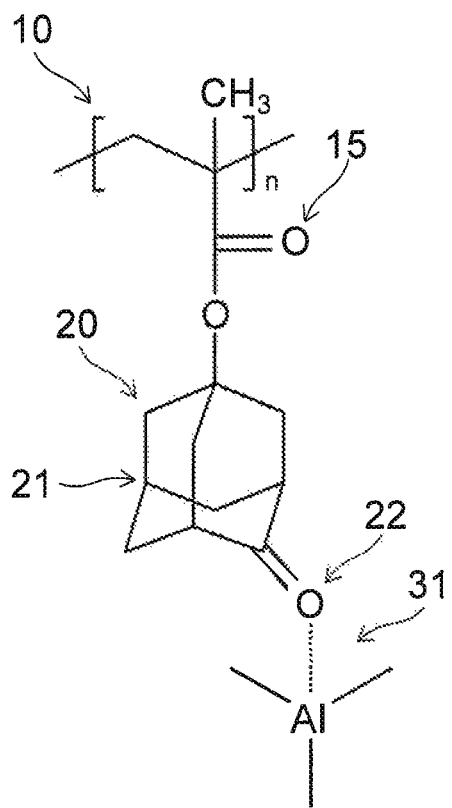
FIG. 3A to FIG. 3C are schematic views showing states in the pattern formation method.
Figure 3B:
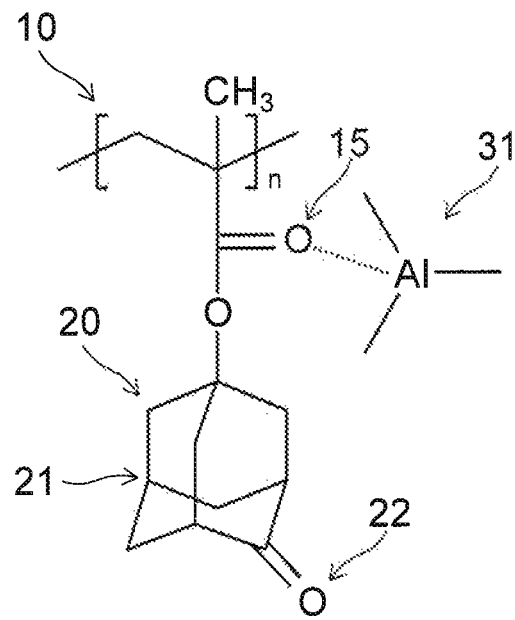
Figure 3C:
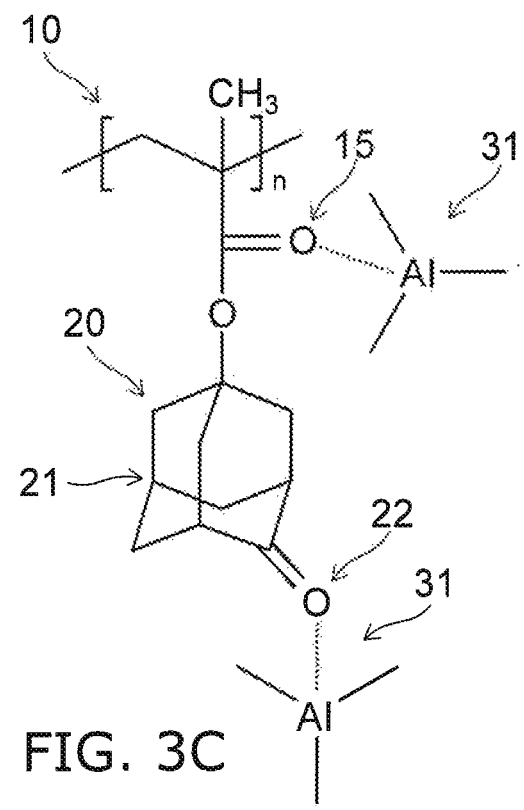

FIG. 3A to FIG. 3C are schematic views showing states in the pattern formation method.

These drawings illustrate the case where the first portion 10 of the pattern formation material 110 includes methacrylate. The metal compound 30 is trimethyl aluminum; and the metal element 31 is aluminum.

In a first state shown in FIG. 3A, the metal element 31 (the aluminum) adsorbs (or bonds) to the carbonyl group 22 of the alicyclic compound 21.

On the other hand, in a second state shown in FIG. 3B, the metal element 31 (the aluminum) adsorbs (or bonds) to the carbonyl group 15 of a side chain of the acrylate.

Stabilization energies ΔE for these states are calculated based on a molecular orbital calculation (GAUSSIAN, etc.) using first principles. As a result, the stabilization energy ΔE in the first state is −18.28 kcal/mol. On the other hand, the stabilization energy ΔE in the second state is −14.73 kcal/mol. Thus, from the calculations, it was found that the first state is more stable than the second state.

In a third state shown in FIG. 3C, the metal element 31 (the aluminum) adsorbs (or bonds) to the two sites of the carbonyl group 22 of the alicyclic compound 21 and the carbonyl group 15 of the ester site of the acrylate. In the third state, the stabilization energy ΔE is −32.21 kcal/mol. This value shows that the stabilization energy ΔE of the third state is substantially equal to the sum of the first state and the second state. This means that the metal element 31 easily adsorbs to one more metal element 31 even after adsorbing in the first state or the second state. That is, simply put, the metal element 31 adsorption capacity per segment is 2 times.

This means that the metal element 31 (the aluminum) can be included efficiently in the pattern formation material film 50 by providing the carbonyl group 22 at the alicyclic compound 21.

The phenomenon described above occurs similarly for metal compounds other than trimethyl aluminum. For example, the phenomenon occurs similarly for $TiCl_4$, $WCl_6$, $VCl_4$, etc.

For example, a pattern formation material of a reference example is considered in which the carbonyl group 22 of the alicyclic compound 21 is not provided. In such a case, only the second state recited above is formed.

Conversely, in the embodiment, the carbonyl group 22 is provided at the alicyclic compound 21. Thereby, compared to the reference example recited above, the metal element 31 (the aluminum) can be included in the pattern formation material film 50 with a high efficiency. Thereby, the concentration of the oxide including the metal element 31 inside the pattern formation material film 50 due to the processing process (e.g., the oxidation process) recited above can be higher.

Thus, after the exposure process in the embodiment, the metal element 31 adsorbs to the carbonyl group 22 bonded to the alicyclic compound 21. For example, the first state recited above is formed.

In the embodiment, the second state may be formed in addition to the first state. For example, after the exposure process, the metal element 31 may adsorb to the carbonyl group 15 included in at least one of acrylate or methacrylate.

Second Embodiment

A second embodiment relates to a pattern formation material.

The pattern formation material (the pattern formation material 110 or 111) according to the embodiment includes the second portion 20, and the first portion 10 including at least one of acrylate or methacrylate (referring to FIG. 1A and FIG. 1B). The second portion 20 includes the alicyclic compound 21 and the carbonyl group 22. The alicyclic compound 21 has an ester bond to the at least one of the acrylate or the methacrylate recited above. The carbonyl group 22 is bonded to the alicyclic compound 21. The pattern formation material is used in a pattern formation method including a process of causing a film including the pattern formation material (e.g., the pattern formation material film 50) to expose to the metal compound 30 including the metal element 31.

According to the pattern formation material according to the embodiment, for example, a pattern formation material that has high etching resistance can be provided. For example, a pattern formation material can be provided in which it is possible to improve productivity.

The embodiments may include the following configurations (technological proposals).

Configuration 1

A pattern formation method, comprising:

a film formation process of forming a pattern formation material film on a base body, the pattern formation material film including a pattern formation material including a first portion and a second portion, the first portion including at least one of acrylate or methacrylate, the second portion including an alicyclic compound and a carbonyl group, the alicyclic compound having an ester bond to the at least one of the acrylate or the methacrylate, the carbonyl group being bonded to the alicyclic compound; and a exposure process of causing the pattern formation material film to expose to a metal compound including a metal element.

Configuration 2

The pattern formation method according to Configuration 1, wherein the film formation process includes:
  forming a film on the base body, the film including the pattern formation material;
  irradiating an electromagnetic wave on a first region of the film; and
  removing the first region of the film, and
the pattern formation material film is obtained from a remaining region of the film.

Configuration 3

The pattern formation method according to Configuration 2, wherein a peak wavelength of the electromagnetic wave is less than 194 nm.

Configuration 4

The pattern formation method according to Configuration 2 or 3, wherein the electromagnetic wave is emitted from an ArF excimer laser.

Configuration 5

The pattern formation method according to any one of Configurations 1 to 4, wherein the exposure process includes introducing the metal compound into the pattern formation material film.

Configuration 6

The pattern formation method according to any one of Configurations 1 to 5, wherein the exposure process includes causing the pattern formation material film to contact at least one of a liquid including the metal compound or a gas including the metal compound.

Configuration 7

The pattern formation method according to any one of Configurations 1 to 6, wherein after the exposure process, the metal element adsorbs to the carbonyl group bonded to the alicyclic compound.

Configuration 8

The pattern formation method according to any one of Configurations 1 to 6, wherein after the exposure process, the metal element adsorbs to a carbonyl group included in the at least one of the acrylate or the methacrylate.

Configuration 9

The pattern formation method according to any one of Configurations 1 to 8, further comprising a processing process of processing, after the exposure process, the pattern formation material film in an atmosphere including at least one selected from the group consisting of water, oxygen, and ozone.

Configuration 10

The pattern formation method according to Configuration 9, wherein after the processing process, the pattern formation material film includes an oxide including the metal element.

Configuration 11

The pattern formation method according to any one of Configurations 1 to 10, further comprising a removal process of removing, after the processing process, at least a portion of a region of the base body not covered with the pattern formation material film.

Configuration 12

The pattern formation method according to Configuration 11, wherein the removal process includes causing the not-covered region to contact a gas including fluorine and carbon.

Configuration 13

The pattern formation method according to Configuration 11 or 12, wherein a width of at least a portion of the not-covered region along a first direction along the base body is 100 nm or less.

Configuration 14

The pattern formation method according to any one of Configurations 1 to 13, wherein the metal compound includes an organic metal compound.

Configuration 15

The pattern formation method according to any one of Configurations 1 to 13, wherein the metal compound includes trimethyl aluminum.

Configuration 16

The pattern formation method according to any one of Configurations 1 to 7, wherein the metal compound includes chlorine and at least one selected from the group consisting of Ti, V, and W.

Configuration 17

The pattern formation method according to any one of Configurations 1 to 16, wherein the alicyclic compound includes multiple cyclic hydrocarbons bonded to each other.

Configuration 18

The pattern formation method according to any one of Configurations 1 to 17, wherein the alicyclic compound includes at least one selected from the group consisting of an adamantane ring, a tricyclodecane ring, an isobornane ring, a norbornane ring, a tetracyclododecane ring, and a cyclohexane ring.

Configuration 19

The pattern formation method according to any one of Configurations 1 to 18, wherein
the first portion includes a side chain, and
the alicyclic compound is bonded to the side chain.

Configuration 20

A pattern formation material, comprising:
a first portion including at least one of acrylate or methacrylate; and
a second portion including an alicyclic compound and a carbonyl group, the alicyclic compound having an ester bond to the at least one of the acrylate or the methacrylate, the carbonyl group being bonded to the alicyclic compound,
the pattern formation material being used in a pattern formation method including causing a film including the pattern formation material to expose to a metal compound including a metal element.

According to the embodiments, a pattern formation method and a pattern formation material can be provided in which it is possible to improve the productivity.

Hereinabove, embodiments of the invention are described with reference to specific examples. However, the invention is not limited to these specific examples. For example, one skilled in the art may similarly practice the invention by appropriately selecting specific configurations of components such as the pattern formation material, the metal element, and the metal compound used in the pattern formation method, the acrylate, the methacrylate, and the alicyclic compound included in the pattern formation material, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All pattern formation methods and pattern formation materials practicable by an appropriate design modification by one skilled in the art based on the pattern formation method and the pattern formation material described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method, comprising:
forming a pattern formation material film on a base body, the pattern formation material film including a pattern formation material including a monomer which includes a first portion and a second portion, the first portion including at least one of acrylate or methacrylate, the second portion including an alicyclic compound and a carbonyl group, the alicyclic compound having an ester bond to the at least one of the acrylate or the methacrylate of the first portion, the carbonyl group being bonded to the alicyclic compound of the second portion;

patterning the pattern formation material film by removing a first region of the pattern formation material film; and exposing the pattern formation material film to a metal compound including a metal element after the patterning the pattern formation material.

2. The method according to claim 1, wherein,
the patterning the pattern formation material film further comprises:
  irradiating an electromagnetic wave on the first region of the pattern formation material film before removing the first region of the pattern formation material film.

3. The method according to claim 2, wherein a peak wavelength of the electromagnetic wave is less than 194 nm.

4. The method according to claim 2, wherein the electromagnetic wave is emitted from an ArF excimer laser.

5. The method according to claim 1, wherein the metal compound includes an organic metal compound.

6. The method according to claim 1, wherein the metal compound includes trimethyl aluminum.

7. The method according to claim 1, wherein the metal compound includes chlorine and at least one selected from the group consisting of Ti, V, and W.

8. The method according to claim 1, wherein the alicyclic compound includes a plurality of cyclic hydrocarbons bonded to each other.

9. The method according to claim 1, wherein the alicyclic compound includes at least one selected from the group consisting of an adamantane ring, a tricyclodecane ring, an isobornane ring, a norbornane ring, a tetracyclododecane ring, and a cyclohexane ring.

10. The method according to claim 1, wherein
the first portion includes a side chain, and
the alicyclic compound is bonded to the side chain.

* * * * *